(12) United States Patent
Moon et al.

(10) Patent No.: US 7,317,779 B2
(45) Date of Patent: Jan. 8, 2008

(54) METHOD OF DRIVING TRANSISTOR AND SHIFT REGISTER PERFORMING THE SAME

(75) Inventors: Seung-Hwan Moon, Yongin-si (KR); Nam-Soo Kang, Ansan-si (KR); Kyung-Eun Lee, Seoul (KR); Back-Won Lee, Seoul (KR); Ji-Hoon Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 10/771,797

(22) Filed: Feb. 4, 2004

(65) Prior Publication Data

US 2004/0165692 A1 Aug. 26, 2004

(30) Foreign Application Priority Data

Feb. 10, 2003 (KR) .................... 10-2003-0008081

(51) Int. Cl.
*G11C 19/00* (2006.01)

(52) U.S. Cl. ..................... 377/64; 377/74; 377/79; 345/100

(58) Field of Classification Search ............. 377/64, 377/74, 79, 81; 345/100
See application file for complete search history.

(56) References Cited

U.S. PATENT DOCUMENTS

| | | | |
|---|---|---|---|
| 5,517,542 A | | 5/1996 | Huq |
| 5,859,630 A | * | 1/1999 | Huq ........................... 345/100 |
| 6,236,393 B1 | | 5/2001 | Ogawa et al. |
| 6,339,631 B1 | | 1/2002 | Yeo et al. |
| 2002/0044625 A1 | | 4/2002 | Kim et al. |
| 2002/0149318 A1 | * | 10/2002 | Jeon et al. ................ 315/169.1 |
| 2003/0090614 A1 | * | 5/2003 | Kim et al. ................... 349/149 |
| 2004/0046729 A1 | * | 3/2004 | Moon ......................... 345/100 |
| 2004/0207018 A1 | * | 10/2004 | Jang et al. .................. 257/347 |

FOREIGN PATENT DOCUMENTS

EP 0731441 A2 9/1996

OTHER PUBLICATIONS

European Search Report; Application No. EP04002418; Date Sep. 27, 2006 All the references cited in the Search Report are listed above.

* cited by examiner

*Primary Examiner*—Tuan T. Lam
(74) *Attorney, Agent, or Firm*—Cantor Colburn LLP

(57) ABSTRACT

A shift register has multiple stages each of which includes a pull-up part to generate a current gate line driving signal having a first state in response to a first control signal and a clock signal, a pull-down part to generate the current gate line driving signal having a second state in response to a second control signal, a pull-up driver to generate the first control signal to control the pull-up part in response to a previous gate line driving signal provided from a previous stage, a following gate line driving signal provided from a following stage, and an input voltage signal externally provided, and a pull-down driver to generate the second control signal to control the pull-down part in response to a third control signal provided from the pull-up driver and the input voltage signal, in which the second control signal swings between first and second voltage levels in association with the input voltage signal that swings between predetermined voltage levels.

16 Claims, 8 Drawing Sheets

US 7,317,779 B2

METHOD OF DRIVING TRANSISTOR AND SHIFT REGISTER PERFORMING THE SAME

BACKGROUND OF THE INVENTION

1. Field of the Invention

The present invention relates to display devices for displaying images, and more particularly, to a shift register for the display devices and a method of driving a transistor in the shift register.

2. Description of the Related Art

Generally, liquid crystal display devices are equipped with a gate driver integrated circuit which is mounted on a liquid crystal display panel by means of a tape carrier package (TCP) or a chip-on-glass (COG) method. The liquid crystal display devices equipped with a gate driver integrated circuit have disadvantages such as high the manufacturing cost and structural hindrance in designing a liquid crystal display device. To overcome such disadvantages, the liquid crystal display devices have been developed to employ a "gate-IC-less" structure, in which no such gate driver integrated circuit is mounted on a liquid crystal display panel. Instead, in the liquid crystal display devices with the "gate-IC-less" structure, a driving circuit using amorphous-silicon thin film transistors (a-Si TFTs) is employed to perform the substantially same function as performed by the gate driver integrated circuit.

Examples of a shift register circuit for display devices, which includes amorphous-silicon thin film transistors, are disclosed in the U.S. Pat. No. 5,517,542 and the U.S. Laid Open Publication No. 2002-0149318. The shift register circuit disclosed in the U.S. Laid Open Publication No. 2002-0149318 includes seven amorphous-silicon thin film transistors in its each stage.

FIG. 1 is a circuit diagram illustrating a stage of a conventional shift register such as one disclosed in the U.S. Laid Open Publication No. 2002-0149318, and FIG. 2 is a block diagram illustrating a shift register having multiple stages. In a display device having such shift register, the shift register replaces the gate driver integrated circuit. In other words, the shift register is integrated in a thin film transistor liquid crystal display panel to perform the same operation as the gate driver integrated circuit does.

Referring to FIGS. 1 and 2, each of the stages in the shift register includes a pull-up part 110, a pull-down part 120, a pull-up driver 130 and a pull-down driver 140. The present stage receives a gate line driving signal $GOUT_{N-1}$ (or scan line driving signal) from a previous stage, and the present stage generates a gate line driving signal $GOUT_N$.

In case that the present stage is the first stage of the shift register, the first stage receives a start signal STV generated from a timing controller (not shown), and the first stage generates a first gate line driving signal $GOUT_1$. In case that the present stage is the second stage of the shift register, the second stage receives the first gate line driving signal $GOUT_1$ generated from the first stage, and the second stage generates a second gate line driving signal $GOUT_2$. Also, in case that the present stage is an Nth stage, the present stage receives an (N−1)th gate line driving signal $GOUT_{N-1}$ generated from an (N−1)th stage, and the Nth stage generates an Nth gate line driving signal $GOUT_N$. In like manner, the shift register having the N stages sequentially generates the gate line driving signals $GOUT_1, GOUT_2, \ldots, GOUT_N$.

The shift register also receives clock signals CKV and CKVB and voltage signals externally provided, and each stage of the shift register has multiple input terminals to receive those signals as well as other control signals and an output terminal to generate the corresponding gate line driving signal. A description of the overall operation of the shift register in FIG. 2 follows.

The first stage $SRC_1$ receives the start signal STV generated from the timing controller (not shown), a gate turn-on voltage VON, a gate turn-off voltage VOFF, and a first clock signal CKV. The first stage SRC1 generates the first gate line driving signal $GOUT_1$ for selecting a first gate line. The first gate line driving signal $GOUT_1$ is provided to the first gate line and an input terminal (IN) of the second stage SRC2.

The second stage $SRC_2$ receives the first gate line driving signal $GOUT_1$ generated from the first stage SRC1, the gate turn-on voltage VON, the gate turn-off voltage VOFF, and a second clock signal CKVB. The second stage SRC2 generates the second gate line driving signal $GOUT_2$ for selecting a second gate line. The second gate line driving signal $GOUT_2$ is provided to the second gate line and an input terminal (IN) of the third stage $SRC_3$.

Likewise, the Nth stage $SRC_N$ receives the (N−1)th gate line driving signal $GOUT_{N-1}$ generated form the (N−1)th stage, the gate turn-on voltage VON, the gate turn-off voltage VOFF, and the second clock signal CKVB. The Nth stage $SRC_N$ generates the Nth gate line driving signal $GOUT_N$ for selecting an Nth gate line. The Nth gate line driving signal $GOUT_N$ is provided to the Nth gate line and an input terminal (IN) of the (N+1)th stage $SRC_{N+1}$.

FIG. 3 is a timing diagram for describing the operation of the conventional shift register in FIGS. 1 and 2. Referring to FIGS. 1, 2 and 3, the shift register receives the first clock signal CKV and the second clock signal CKVB and sequentially outputs the gate line driving signals to the gate lines formed on a TFT substrate. The second clock signal CKVB has a 180° phase difference with respect to the first clock signal CKV. The amplitudes of the first and second clock signals CKV, CKVB are in a range from about −8 volt to about 24 volt. The amplitude of the output signal of the timing controller (not shown) is in a range from about 0 volt to about 3 volt. Thus, the output signal of the timing controller (not shown) is amplified so that the first and second clock signals CKV, CKVB have the amplitudes in the range from about −8 volt to about 24 volt.

Since the NMOS transistor Q1 of the pull-up part 110 includes amorphous-silicon, the NMOS transistor Q1 has a relatively large transistor size. This is because, in order to drive the liquid crystal display device having a large screen size, a large amplitude of voltage (for example, from −14V to 20V) should be applied to the NMOS transistor Q1 due to the very small electron mobility of the amorphous-silicon of the NMOS transistor Q1. For example, in a liquid crystal display panel having a screen size of 12.1 inch (XGA), parasitic capacitance of a gate line has a value from about 250 pF to about 300 pF. Therefore, in order to drive an amorphous-silicon thin film transistor designed in accordance with minimum design rule 4 μm, a channel width of the amorphous-silicon thin film transistor should be about 5500 μm when a channel length of the amorphous-silicon thin film transistor is about 4 μm.

Therefore, the parasitic capacitance between a gate electrode and a drain electrode of the NMOS amorphous-silicon thin film transistor Q1 increases. The value of the parasitic capacitance is about 3 pF. This value causes a malfunction of the gate driver circuit employing the NMOS amorphous-silicon thin film transistor. The malfunction occurs as follows.

The parasitic capacitor is electrically connected with a terminal to which the clock signal CKV or CKVB having a large amplitude of voltage (for example, from about −14V to about 20V) is applied, and the parasitic capacitor (or coupling capacitor) is electrically connected between the drain and gate electrodes of the NMOS amorphous-silicon thin film transistor Q1 to apply undesired voltage signal to the gate electrode of the NMOS amorphous-silicon thin film transistor Q1.

Assuming that there is no means for maintaining the voltage level of the gate electrode of the NMOS amorphous-silicon thin film transistor Q1 at the gate turn-off voltage level VOFF, the clock signal CKV or CKVB having the amplitude between about −14V and about 20V is applied to the gate electrode of the NMOS amorphous-silicon thin film transistor Q1. In this case, the voltage level of the gate electrode of the NMOS transistor Q1 becomes in the range from about −14V to about 20V, and the output signal equals to '20V (maximum value)−Vth (the threshold voltage of the NMOS amorphous-silicon transistor Q1)'. Applying such output signal to the gate line of the liquid crystal display panel causes abnormal display of images.

In order to maintain the voltage level of the gate electrode of the pull-up transistor Q1 at the gate turn-off voltage level VOFF, a hold transistor Q5 is employed. The hold transistor Q5 is an amorphous-silicon thin film transistor. Also, a pull-down thin film transistor Q2 performing a pull down function is employed to maintain the scan signal at the gate turn-off voltage level VOFF during most of the period after the pull-up transistor Q1 operates.

Since the a-Si transistor includes an N type MOSFET, the hold transistor Q5 receives a DC voltage signal proportional to the gate turn-on voltage VON (DC voltage signal) through the gate electrode of the hold transistor Q5 during the period except for the time period of 'one vertical synchronization period—two horizontal synchronization periods'. In addition, the pull-down transistor Q2 receives a DC voltage signal proportional to the gate turn-on voltage VON (DC voltage signal) through the gate electrode of the pull-down transistor Q2 during the period except for the time period of 'one vertical synchronization period—two horizontal synchronization period'. Hereinafter, one vertical synchronization period denotes a time interval between two consecutive frames. Namely, one vertical synchronization period is referred to as the time interval between the vertical synchronization signals (Vsync). The vertical synchronization signal (Vsync) indicates the point of time where a frame begins. One horizontal synchronization period denotes a time interval between two consecutive scan lines. Namely, one horizontal synchronization period is referred to as the time interval between the horizontal synchronization signals (Hsync). The horizontal synchronization signal (Hsync) indicates the point of time where a scan line of a frame begins.

When the gate driver integrated circuit employs a-Si transistors, the pull-down transistor Q2 and the hold transistor Q5 may be deteriorated since the DC voltage signal is applied to the gate electrodes of the pull-down transistor Q2 and the hold transistor Q5 for most of the operation period.

When DC voltage signal is continuously applied to the gate electrodes of the a-Si transistors (pull-down transistor Q2 and hold transistor Q5) for a predetermined period, the pull-down transistor Q2 and hold transistor Q5 are deteriorated, so that display quality of the liquid crystal display device becomes deteriorated. In other words, since the threshold voltages (Vth) of the a-Si transistors (pull-down transistor Q2 and hold transistor Q5) are increased due to the deterioration of the a-Si transistors, normal gate-source voltage Vgs becomes unable to turn on the a-Si transistors (pull-down transistor Q2 and hold transistor Q5) when the a-Si transistors (pull-down transistor Q2 and hold transistor Q5) have a predetermined threshold voltage Vth'.

FIG. 4 is a graph showing the variation of the threshold voltage of an a-Si TFT when a DC gate-source voltage is applied to the gate electrode of the a-Si TFT. As shown in FIG. 4, when a DC gate-source voltage is applied to the gate electrode of the a-Si TFT, the threshold voltage (Vth) of the a-Si transistor is increased due to the deterioration of the a-Si transistor. In case that the increased threshold voltage (Vth) reaches the DC gate-source voltage Vgs_dc, the a-Si transistor is not turned on even when a normal gate-source voltage Vgs is applied thereto.

SUMMARY OF THE INVENTION

The above disclosed and other drawbacks and deficiencies of the prior art are overcome or alleviated by a shift register and a method of driving a transistor according to the present invention. In one embodiment, a shift register has a plurality of stages each providing a gate line driving signal to a corresponding gate line of a display panel, and the stages each include a pull-up part to generate a current gate line driving signal having a first state in response to a first control signal and a clock signal, a pull-down part to generate the current gate line driving signal having a second state in response to a second control signal, a pull-up driver to generate the first control signal to control the pull-up part in response to a previous gate line driving signal provided from a previous stage, a following gate line driving signal provided from a following stage, and an input voltage signal externally provided, and a pull-down driver to generate the second control signal to control the pull-down part in response to a third control signal provided from the pull-up driver and the input voltage signal, in which the second control signal swings between first and second voltage levels in association with the input voltage signal that swings between predetermined voltage levels.

The pull-up part includes a pull-up transistor having a conduction path between a terminal receiving the clock signal and a terminal generating the current gate line driving signal, and a gate electrode receiving the first control signal from the pull-up driver. The pull-up driver includes a hold transistor to maintain a voltage level at the gate electrode of the pull-up transistor at a selected voltage level. The hold transistor has a gate electrode receiving the second control signal from the pull-down driver. An amplitude of a gate-source voltage of the hold transistor is larger than two times a threshold voltage of the hold transistor. The input voltage signal has an amplitude larger than seven times a threshold voltage of the hold transistor. The pull-down part includes a pull-down transistor having a conduction path between a terminal generating the current gate line driving signal and a terminal having a selected voltage level. The pull-down transistor has a gate electrode receiving the second control signal from the pull-down driver.

The pull-down driver includes an inverter to generate a fourth control signal in response to the input voltage signal and the third control signal from the pull-up driver, and a deterioration compensation part to generate the second control signal in response to the input voltage signal, the third control signal from the pull-up driver, and the fourth control signal from the inverter. The inverter includes a first transistor having a conduction path between a terminal receiving the input voltage signal and a first node, the first transistor operating as a diode, and a second transistor having a conduction path between the first node and a terminal having a selected voltage level and a gate electrode receiving the third control signal from the pull-up driver, in which the inverter generates the fourth control signal from the first node. The deterioration compensation part includes a third transistor having a conduction path between the terminal receiving the input voltage signal and a second node and a gate electrode receiving the fourth control signal from the inverter, and a fourth transistor having a conduction path between the second node and the terminal having the selected voltage level and a gate electrode receiving the third control signal from the pull-up driver, in which the deterioration compensation part generates the second control signal from the second node.

In another embodiment, a method of driving a transistor having gate, drain and source electrodes includes applying a first voltage signal to the drain electrode, applying a second voltage signal to the source electrode, and applying a third voltage signal to the gate electrode to control an electrical conduction path between the drain and source electrodes, in which the third voltage signal swings between predetermined voltage levels, so that a gate-source voltage signal established between the gate and source electrodes of the transistor swings between first and second voltage levels at a selected period. The gate-source voltage signal has an amplitude larger than two times a normal threshold voltage of the transistor.

BRIEF DESCRIPTION OF THE DRAWINGS

The above and other objects and advantages of the present invention will become readily apparent by reference to the following detailed description when considered in conjunction with the accompanying drawings, in which.

DETAILED DESCRIPTION OF THE INVENTION

The present invention now will be described more fully hereinafter with reference to the accompanying drawings, in which exemplary embodiments of the present invention are shown. This invention may, however, be embodied in many different forms and should not be construed as limited to the embodiments set forth herein.

Hereinafter the preferred embodiment of the present invention will be described in detail with reference to the accompanying drawings.

Figure 1:
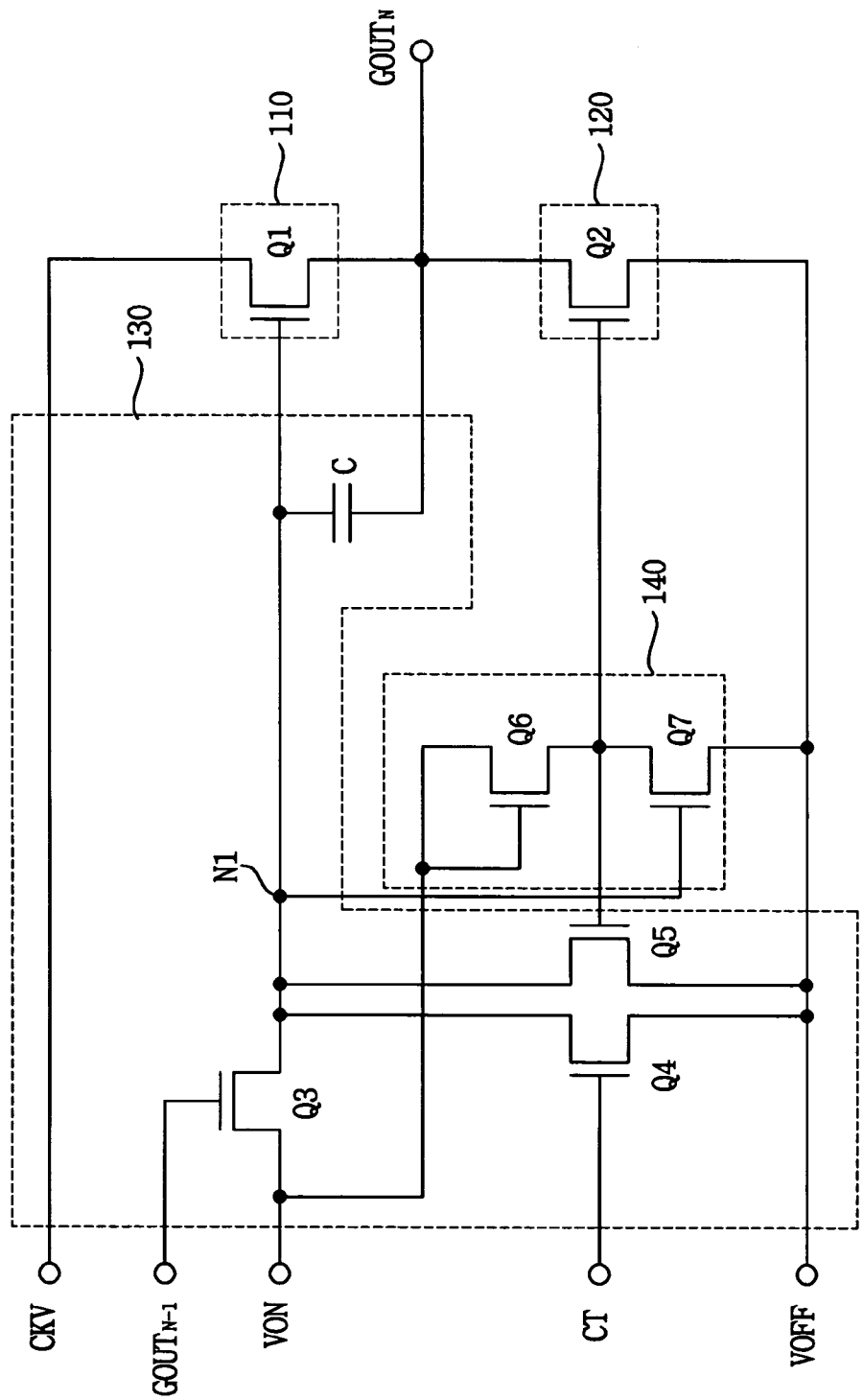
FIG. 1 is a circuit diagram showing a stage of a conventional shift register.
Figure 2:
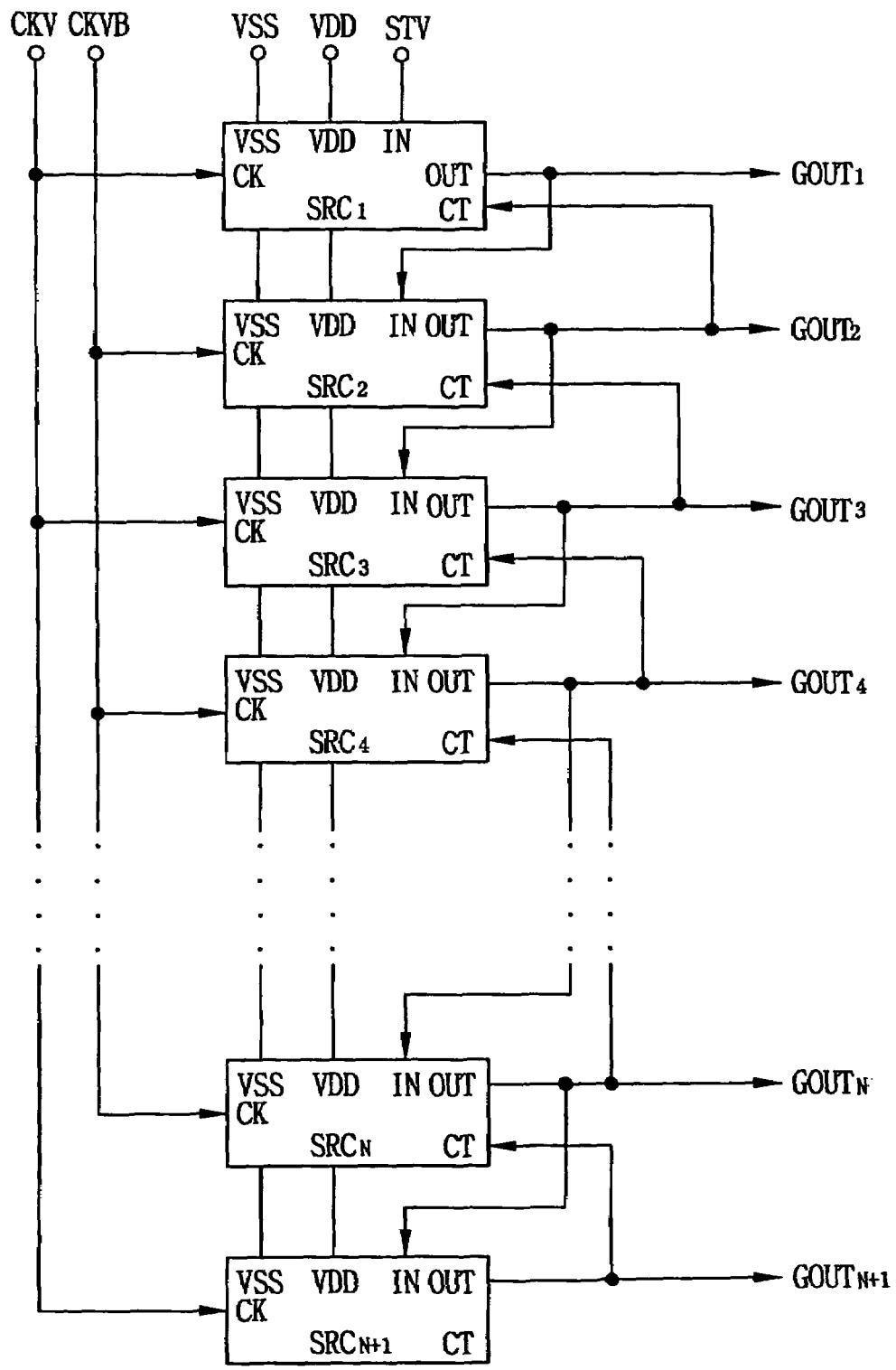
FIG. 2 is a block diagram showing a conventional gate driver circuit.
Figure 3:
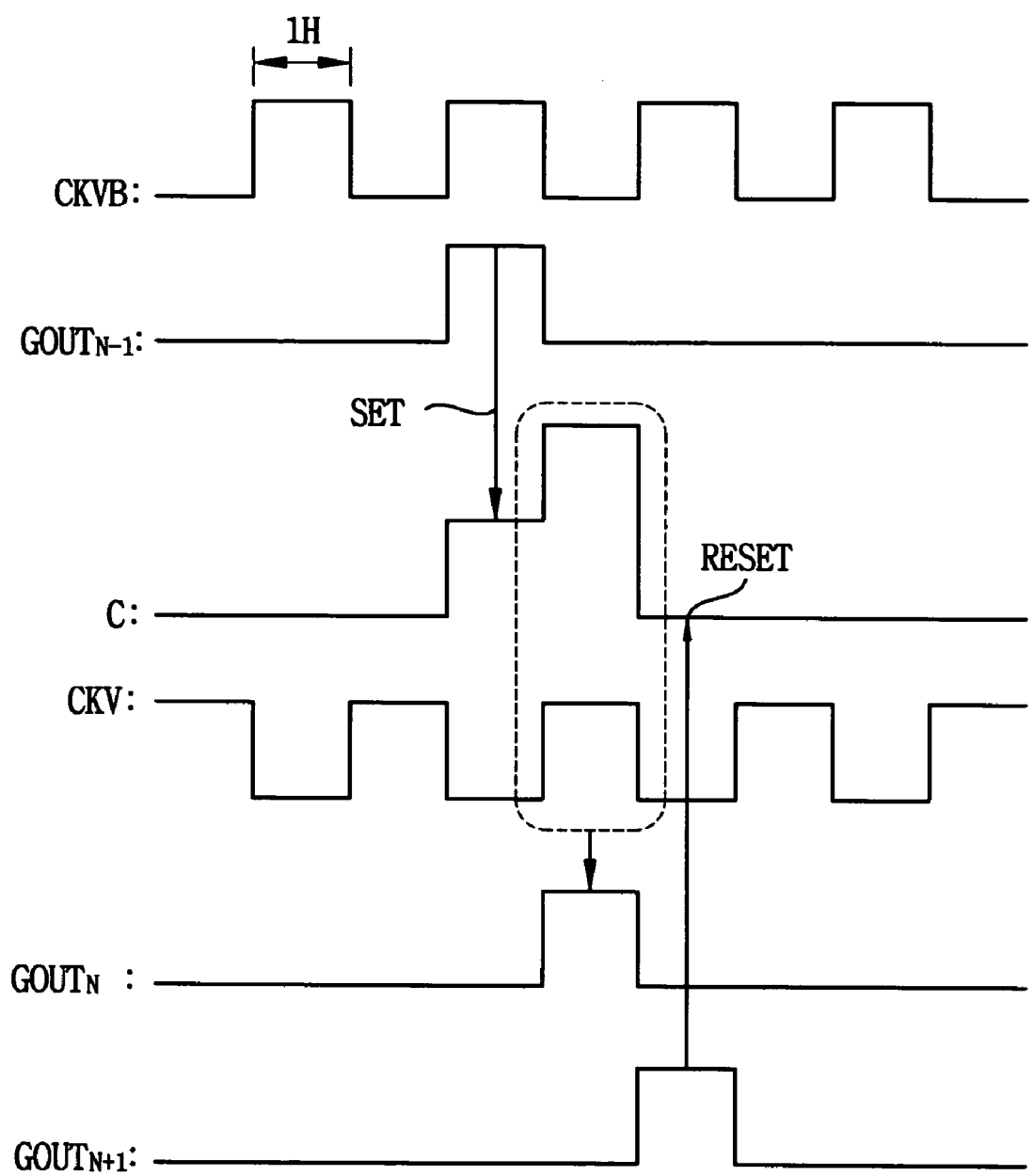
FIG. 3 is a timing diagram for describing the operation of the stage in FIG. 1.
Figure 4:
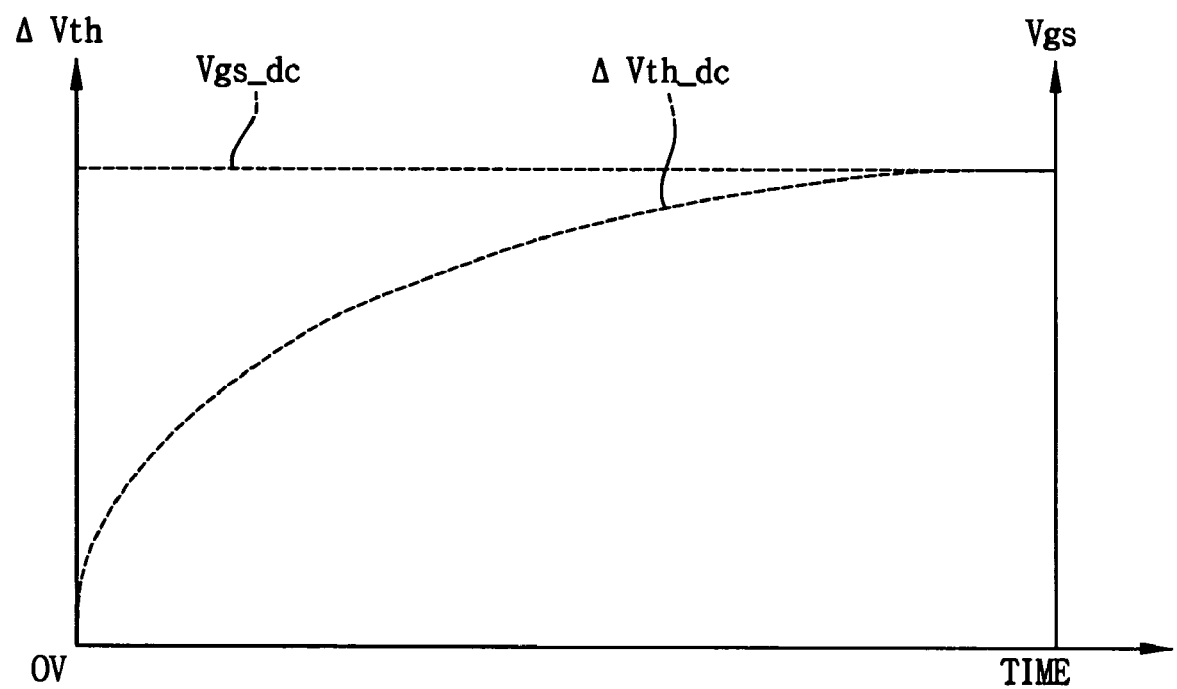
FIG. 4 is a graph showing the variation of the threshold voltage of an a-Si TFT when a DC gate-source voltage is applied to the gate electrode of the a-Si TFT.
Figure 5A:
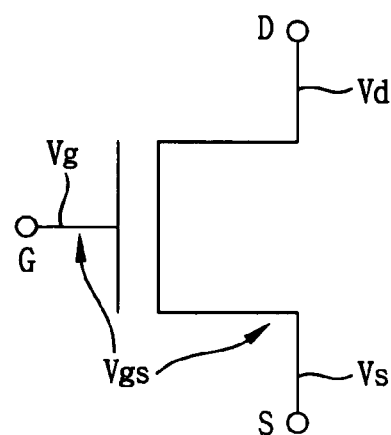
FIG. 5A is an equivalent circuit diagram of an a-Si TFT according to the present invention.
Figure 5B:
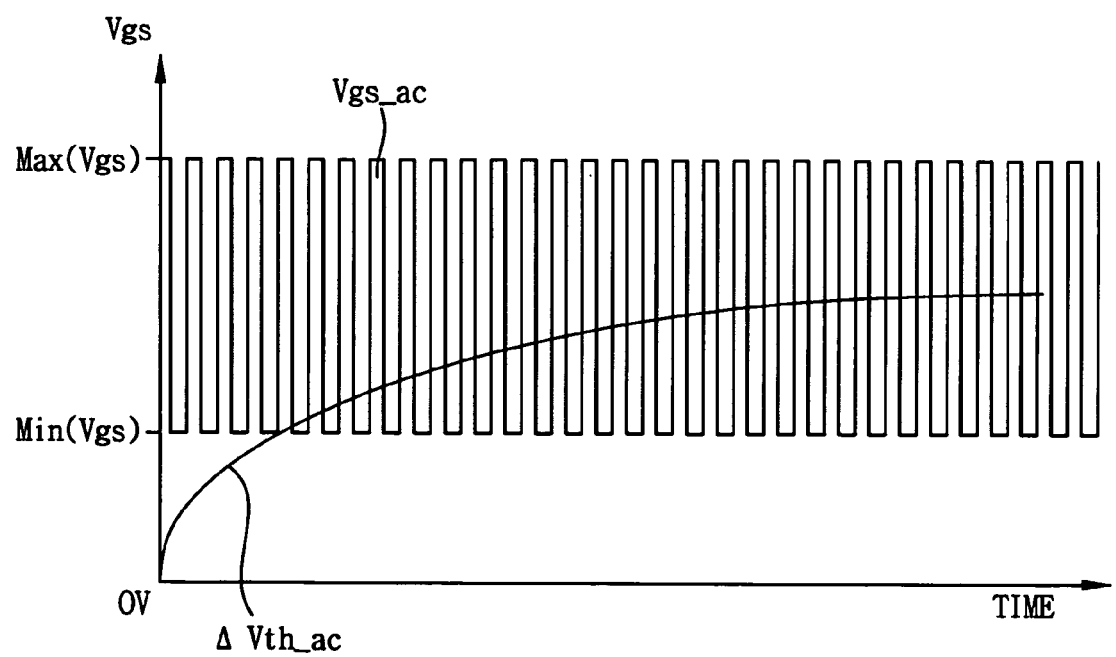
FIG. 5B is a graph showing a waveform of a gate-source voltage signal applied to the gate electrode of the a-Si TFT in FIG. 5A.

FIG. 5A is an equivalent circuit diagram of the an a-Si TFT according to the present invention, and FIG. 5B is a graph showing a waveform of a gate-source voltage signal applied to the a-Si TFT. Referring to FIGS. 5A and 5B, a drain voltage (Vd) is applied to a drain electrode (D) of the a-Si TFT, a source voltage (Vs) is applied to a source electrode (S) of the a-Si TFT, and a gate voltage (Vg) is applied to a gate electrode (G) of the a-Si TFT. When the gate voltage (Vg) is applied to the gate electrode (G) of the a-Si TFT, the a-Si TFT becomes turned on or off depending on the gate-source voltage (Vgs), a voltage difference between the gate voltage (Vg) and the source voltage (Vs). For example, when the gate-source voltage (Vgs) applied to the gate electrode (G) of the a-Si TFT is lower than the threshold voltage of the a-Si TFT, the a-Si TFT is turned off. When the gate-source voltage (Vgs) applied to the gate electrode (G) of the a-Si TFT is higher than the threshold voltage of the a-Si TFT, the a-Si TFT is turned on.

In this embodiment, a gate-source voltage (Vgs_ac) signal as shown in FIG. 5B is established between the gate electrode (G) and the source electrode (S) of the a-Si TFT. The gate-source voltage (Vgs_ac) signal is a pulse signal swinging between a maximum voltage level Max(Vgs) and a minimum voltage level Min(Vgs) at a predetermined period. The gate voltage (Vg) applied to the gate electrode (G) of the a-Si TFT is also a pulse signal swinging between a maximum voltage level and a minimum voltage level at a predetermined period, so that the gate-source voltage (Vgs_ac) is established between the gate and source electrodes of the a-Si TFT. By providing the gate-source voltage (Vgs_ac) in the a-Si TFT, the a-Si TFT operates normally even when the deterioration of the a-Si TFT occurs.

Since the gate-source voltage (Vgs_ac) between the gate electrode (G) and the source electrode (S) of the a-Si TFT swings between the maximum voltage level Max(Vgs) and the minimum voltage level Min(Vgs) at the predetermined period, the a-Si transistor is turned on even when a normal threshold voltage of the a-Si TFT is increased by 'ΔVth' due to the deterioration of the a-Si transistor. As shown in FIG. 5B, since the increased threshold voltage (ΔVth_ac) is smaller than the maximum voltage level Max(Vgs), the a-Si transistor is turned on even when the normal threshold voltage (Vtho) is increased by 'ΔVth' due to the deterioration of the a-Si transistor. This description is presented by the following Expression 1.

$$\text{Max}(Vgs) - [Vtho + \Delta Vth] > 0 \qquad \text{Expression 1}$$

Here, 'Vtho' denotes the normal threshold voltage of the a-Si transistor, 'ΔVth' denotes a voltage difference between the threshold voltage of the deteriorated a-Si TFT and the normal threshold voltage of the a-Si transistor. To provide the a-Si transistor with the gate-source voltage (Vgs_ac), a pulse-type gate voltage (Vg) signal swinging between a maximum voltage and a minimum voltage at the predetermined period is applied to the gate electrode (G) of the a-Si TFT in a shift register.

Figure 6:
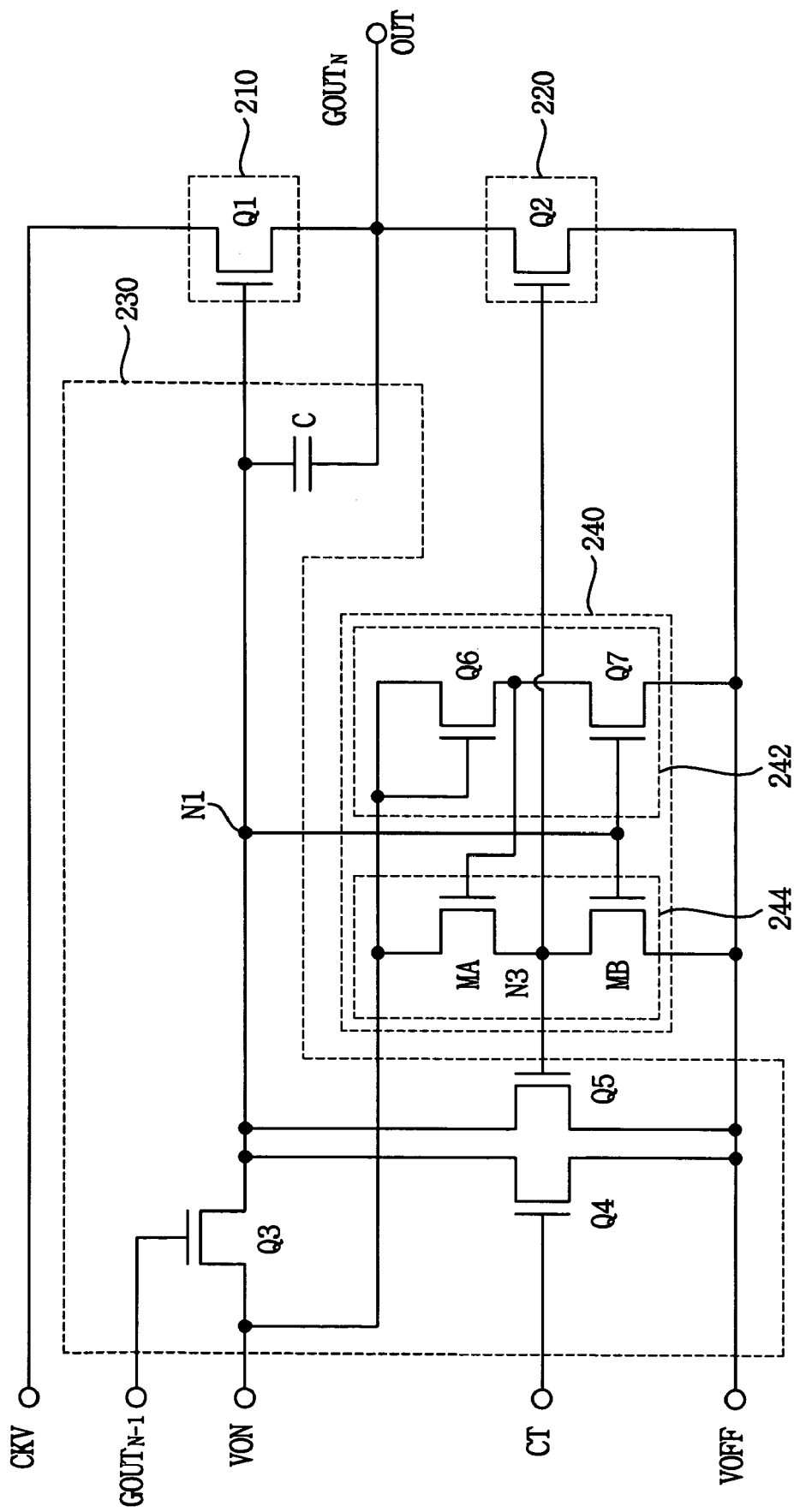
FIG. 6 is a circuit diagram showing a stage of a shift register according to the present invention.

FIG. 6 is a circuit diagram showing a stage of a shift register according to an exemplary embodiment of the present invention. The shift register has multiple stages each having the substantially same configuration as shown in FIG. 6. The stage of the shift register includes a pull-up part 210, a pull-down part 220, a pull-up driver 230, and a pull-down driver 240. The current stage receives a gate line driving signal GOUT$_{N-1}$ (or a scan line driving signal) from a previous stage, and generates a current gate line driving signal GOUT$_N$. When the current stage is a first stage of the shift register, the first stage receives a start signal generated from a timing controller (not shown), and generates a first gate line driving signal GOUT$_1$. When the current stage is a second stage of the shift register, the second stage receives the first gate line driving signal GOUT$_1$ generated from the first stage and generates a second gate line driving signal GOUT$_2$. Likewise, when the current stage is an Nth stage, the Nth stage receives an (N–1)th gate line driving signal GOUT$_{N-1}$ generated from the (N–1)th stage and generates the Nth gate line driving signal GOUT$_N$. The stages of the shift register are arranged in such a manner as to generate the gate line driving signals in sequence, and the shift register is integrated in a thin film transistor liquid crystal display panel.

The pull-up part 210 includes a NMOS pull-up transistor Q1. A clock terminal (CKV terminal or CKVB terminal) is connected to the drain electrode of the NMOS pull-up transistor Q1, a gate electrode of the NMOS pull-up transistor Q1 is connected to a first node N1, and an output terminal OUT is connected to a source electrode of the NMOS pull-up transistor Q1.

The pull-down part 220 includes a NMOS pull-down transistor Q2. The output terminal OUT is connected to a drain electrode of the NMOS pull-down transistor Q2, a gate electrode of the NMOS pull-down transistor Q2 is connected to the pull-down driver 240, and a source electrode of the NMOS pull-down transistor Q2 is connected to a gate turn-off voltage (VOFF) terminal.

The pull-up driver 230 includes a capacitor C and NMOS transistors (Q3, Q4, Q5). Particularly, the capacitor C is connected between the first node N1 and the output terminal OUT. A drain electrode of the NMOS transistor Q3 is connected to a gate turn-on voltage (VON) terminal, a gate electrode of the NMOS transistor Q3 is connected to an output terminal OUT$_{N-1}$ of a previous stage, and a source electrode of the NMOS transistor Q3 is connected to the first node N1. For example, the gate turn-on voltage (VON) is a power voltage signal for the shift register. It is noted that the previous stage providing the previous gate line driving signal GOUT$_{N-1}$ is a stage right next to the current stage or one of the stages preceding the current stage.

The NMOS transistor Q4 of the pull-up driver 230 has a drain electrode connected to the first node N1, a gate electrode connected to a control terminal CT, and a source electrode connected to the gate turn-off voltage (VOFF) terminal. The gate turn-off voltage (VOFF) is, for example, a power voltage signal for the shift register. The control terminal CT receives a gate line driving signal from a following stage. It is noted that the following stage providing its output signal (i.e., the gate line driving signal) to the current stage is a stage right next to current stage or one of the stages following the current stage. A drain electrode of the NMOS transistor Q5 is connected to the first node N1, a gate electrode of the NMOS transistor Q4 is connected to the gate electrode of the pull-down NMOS transistor Q2, and a source electrode of the NMOS transistor Q5 is connected to the gate turn-off voltage (VOFF) terminal.

The pull-down driver 240 includes an inverter 242 and a deterioration compensation part 244. The inverter 242 includes two NMOS transistors Q6 and Q7, and the deterioration compensation section 244 includes two NMOS transistors MA and MB.

In the inverter 242, gate and drain electrodes of the NMOS transistor Q6 are commonly connected to the gate turn-on voltage (VON) terminal. A drain of the NMOS transistor Q7 is connected to the source of the NMOS transistor Q6, a gate of the NMOS transistor Q7 is connected to the source of the NMOS transistor Q3 via the first node N1, and a source electrode of the NMOS transistor Q7 is connected to the gate turn-off voltage (VOFF) terminal.

In the deterioration compensation part 244, a drain of the NMOS transistor MA is connected to the gate turn-on voltage (VON) terminal, a gate of the NMOS transistor MA is connected to the source electrode of the NMOS transistor Q6 and the drain electrode of the NMOS transistor Q7. A source electrode of the NMOS transistor MA is connected to a third node N3 that is connected to the gate electrodes of the pull-down transistor Q2 and the hold transistor Q5. A drain of the NMOS transistor MB is connected to the third node N3. A gate of the NMOS transistor MB is connected to the first node N1, and a source electrode of the NMOS transistor MB is connected to the gate turn-off voltage (VOFF) terminal. The deterioration compensation section 244 provides a pulse-type voltage signal to the gate electrodes of the pull-down transistor Q2 and the hold transistor Q5. The pulse-type voltage signal swings between predetermined maximum and minimum voltage values.

Hereinafter, the operation of the stage in FIG. 6 is explained in detail. When a maximum voltage of the gate turn-on voltage signal VON is applied to the gate turn-on voltage VON terminal, the NMOS transistor Q6 is turned on and the gate capacitor of the NMOS transistor MA is charged with a voltage of the following Expression 2.

$$V(MA\_Gate) = \text{Max}(VON) - Vth(Q6) \quad \text{Expression 2}$$

Here, 'V(MA_Gate)' denotes the voltage applied to the gate of the NMOS transistor MA, 'Max(VON)' denotes the maximum voltage of the gate turn-on voltage signal VON, and 'Vth(Q6)' denotes the threshold voltage of the NMOS transistor Q6. When the gate capacitor of the gate of the NMOS transistor MA is charged with the voltage V(MA_Gate), the third node N3 connected with the gate electrodes of the pull-down transistor Q2 and the hold transistor Q5 has a voltage of the following Expression 3.

$$V(N3) = V(MA\_Gate) - Vth(MA)$$
$$= \text{Max}(VON) - Vth(Q6) - Vth(MA) \quad \text{Expression 3}$$

Here, 'V(N3)' denotes the voltage at the third note N3, and 'Vth(MA)' denotes the threshold voltage of the NMOS transistor MA.

When a minimum voltage of the turn-on voltage signal is applied to the gate turn-on voltage VON terminal, the NMOS transistor Q6 is turned off and the voltage applied to the gate capacitor of the NMOS transistor MA decreases due to the coupling effect between the voltage level of the drain electrode of the NMOS transistor MA and the voltage level of the third node N3. Since the minimum voltage of the turn-on voltage signal is smaller than the voltage at the third node N3, the third node N3 is discharged in accordance with the condition such as 'V(MA_Gate)>Min(VON)+Vth(MA)' (here, 'Min(VON)' denotes the minimum voltage of the turn-on voltage signal VON).

In case that the NMOS transistor MA is a symmetric transistor, half of the total parasitic capacitance of the NMOS transistor MA is substantially equal to the parasitic capacitance Cgs between the gate and source electrodes of the NMOS transistor MA and also to the parasitic capacitance Cgd between the gate and drain electrodes of the NMOS transistor MA. In this case, when the minimum turn-on voltage signal Min(VON) is applied to the gate turn-on voltage VON terminal, the third node N3 has a voltage of the following Expression 4.

$$V(N3)=\text{Min}(VON)+3\times Vth(MA) \quad \text{Expression 4}$$

This is because the gate electrode of the NMOS transistor MA is discharged until the voltage V(MA_Gate) of the gate electrode of the NMOS transistor MA reaches the voltage value of 'the minimum turn-on voltage signal Min(VON)+ the threshold voltage Vth(MA) of the NMOS transistor MA'. The voltage V(N3) at the third node N3 is applied to the gate electrodes of the pull-down transistor Q2 and the hold transistor Q5.

In this embodiment, to maintain the gate turn-off voltage level at the gate of the pull-up transistor Q1, the pull-down a-Si transistor Q2 is turned on when the voltage level of the clock signal (CKV or CKVB) changes from a low level to a high level during the period of 'one vertical synchronization period—one horizontal synchronization period'. Also, the pull-down a-Si transistor Q5 is turned on when the voltage level of the clock signal (CKV or CKVB) changes from a low level to a high level during the period of 'one vertical synchronization period—tow horizontal synchronization periods'.

In order to turn-on the pull-down transistor Q2 (or the hold transistor Q5), the maximum value of the gate-source voltage Vgs of the pull-down transistor Q2 (or the hold transistor Q5) should be larger than the sum of the normal threshold voltage Vtho of the pull-down transistor Q2 (or the hold transistor Q5) and the threshold voltage difference ΔVth. The threshold voltage difference ΔVth denotes the voltage difference between the normal threshold voltage Vtho and the threshold voltage of a deteriorated pull-down transistor Q2 (or the hold transistor Q5). This is presented by the following Expression 5.

$$\text{Max}(Vgs)-[Vtho+\Delta Vth]>0 \quad \text{Expression 5}$$

Here, 'Max(Vgs)' denotes the maximum value of the gate-source voltage Vgs of the pull-down transistor Q2 (or the hold transistor Q5). Since the pull-down transistor Q2 or the hold transistor Q5 should be maintained in a turn-on state even when the threshold voltage difference ΔVth reaches the value of '(Max(Vgs)+Min(Vgs))/2', the following Expression 6 should be satisfied.

$$\text{Max}(Vgs)-[\{\text{Max}(Vgs)+\text{Min}(Vgs)\}/2+Vtho]>0$$

Thus, $\{\text{Max}(Vgs)-\text{Min}(Vgs)\}/2>Vtho$ $$\text{Therefore, Max}(Vgs)-\text{Min}(Vgs)>2\times Vtho \quad \text{Expression 6}$$

According to the Expression 6, when the amplitude of the gate-source voltage Vgs of the pull-down transistor Q2 (or the hold transistor Q5) is larger than two times that of the normal threshold voltage Vtho, the pull-down transistor Q2 (or the hold transistor Q5) normally operates even when the pull-down transistor Q2 (or the hold transistor Q5) is deteriorated.

The maximum value Max(Vgs) of the gate-source voltage Vgs and the minimum value Min(Vgs) of the gate-source voltage Vgs are presented by the following Expressions 7 and 8, respectively.

$$\text{Max}(Vgs)=\text{Max}(VON)-Vth(Q6)-Vth(MA)-VOFF \quad \text{Expression 7}$$

$$\text{Min}(Vgs)=\text{Min}(VON)+3\times Vth(MA)-VOFF \quad \text{Expression 8}$$

From the Expressions 6 to 8, the following Expression 9 is obtained.

$$[\text{Max}(VON)-Vth(Q6)-Vth(MA)-VOFF]$$

$$-[\text{Min}(VON)+3\times Vth(MA)-VOFF]>2\times Vtho \quad \text{Expression 9}$$

In case that the threshold voltage Vth(Q6) of the NMOS transistor Q6 is substantially equal to the threshold voltage Vth(MA) of the NMOS transistor MA and the threshold voltage Vth(MA) of the NMOS transistor MA is substantially equal to the normal threshold voltage Vtho of the pull-down transistor Q2 (or the hold transistor Q5), the following Expression 10 is obtained from the Expression 9.

$$\text{Max}(VON)-\text{Min}(VON)>7\times Vtho \quad \text{Expression 10}$$

According to the Expression 10, when the amplitude of the gate turn-on voltage VON is larger than seven times that of the normal threshold voltage Vtho of the pull-down transistor Q2 (or the hold transistor Q5), the pull-down transistor Q2 (or the hold transistor Q5) normally operates even when the pull-down transistor Q2 (or the hold transistor Q5) is deteriorated.

Figure 7:
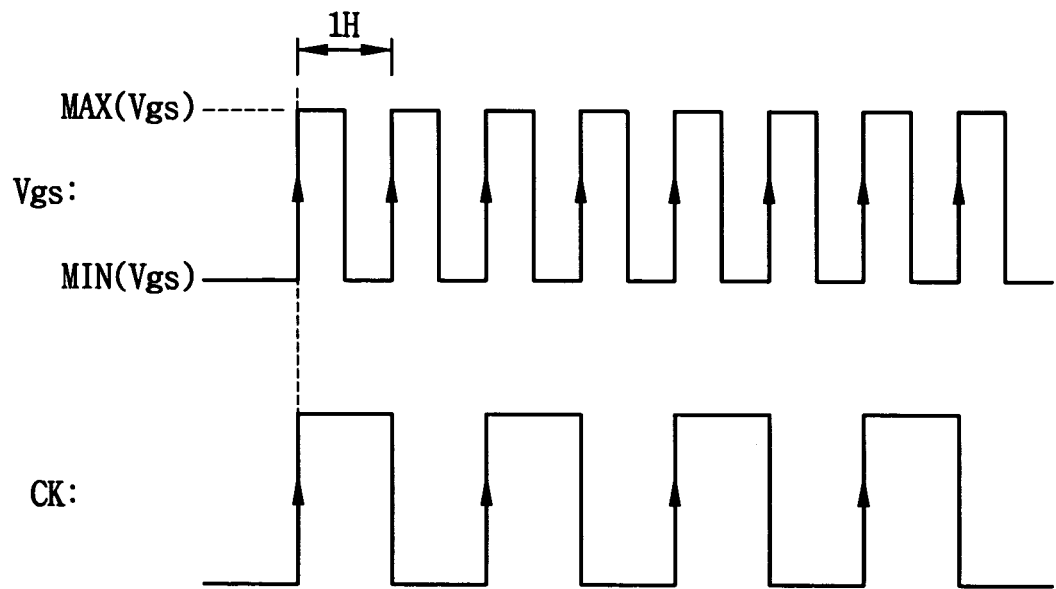
FIG. 7 is a timing diagram showing a gate-source voltage signal applied to the a-Si TFT.

FIG. 7 is a timing diagram showing a waveform of the gate-source voltage signal applied to the a-Si TFT, i.e., the pull-down transistor Q2 or the hold transistor Q5 in this embodiment. In the gate-source voltage signal in FIG. 7, for example, the pulse signal swings between a maximum voltage level MAX(Vgs) and a minimum voltage level MIN(Vgs) and has a predetermined period substantially equal to the half of a period of the clock CK.

In this example, the rising edge of the gate-source voltage signal is synchronized with the rising edge of the clock signal CK, and the voltage level of the gate-source voltage signal changes from the maximum voltage level MAX(Vgs) to the minimum voltage level MIN(Vgs) at the half (½H) of its period (H). Then, the voltage level of the gate-source voltage signal changes from the minimum voltage level MIN(Vgs) to the maximum voltage level MAX(Vgs) when the voltage level of the clock signal CK changes from a high level to a low level. Thus, the gate-source voltage Vgs has the rising edge synchronized with the transition of the clock CK. In other words, the gate-source voltage Vgs has the maximum value when the voltage level of the clock CK changes from the low level to the high level or changes from the high level to the low level.

The gate-source voltage Vgs applied to the pull-down transistor Q2 (or the hold transistor Q5) has the amplitude larger than two times that of the normal threshold voltage Vtho of the pull-down transistor Q2 (or the hold transistor Q5).

Figure 8:
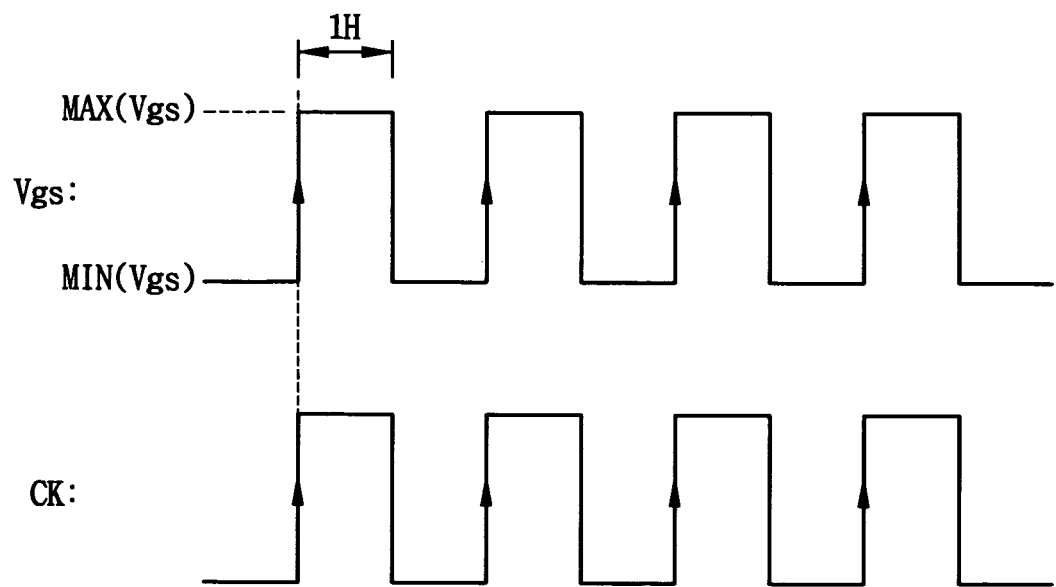
FIG. 8 is a timing diagram showing another gate-source voltage signal applied to the a-Si TFT.

FIG. 8 is a timing diagram showing a waveform of another example of the gate-source voltage signal applied to the a-Si TFT. Referring to FIG. 8, the gate-source voltage signal swings between the maximum voltage level MAX (Vgs) and the minimum voltage level MIN(Vgs) has a predetermined period substantially equal to the period of the clock CK.

In this example, the gate-source voltage signal is synchronized with the clock CK, such that the rising edge of the gate-source voltage signal is synchronized with the rising edge of the clock CK and the falling edge of the gate-source voltage signal is synchronized with the falling edge of the clock CK. The gate-source voltage signal of this example also has the amplitude larger than two times that of the normal threshold voltage Vtho of the pull-down transistor Q2 (or the hold transistor Q5).

Figure 9:
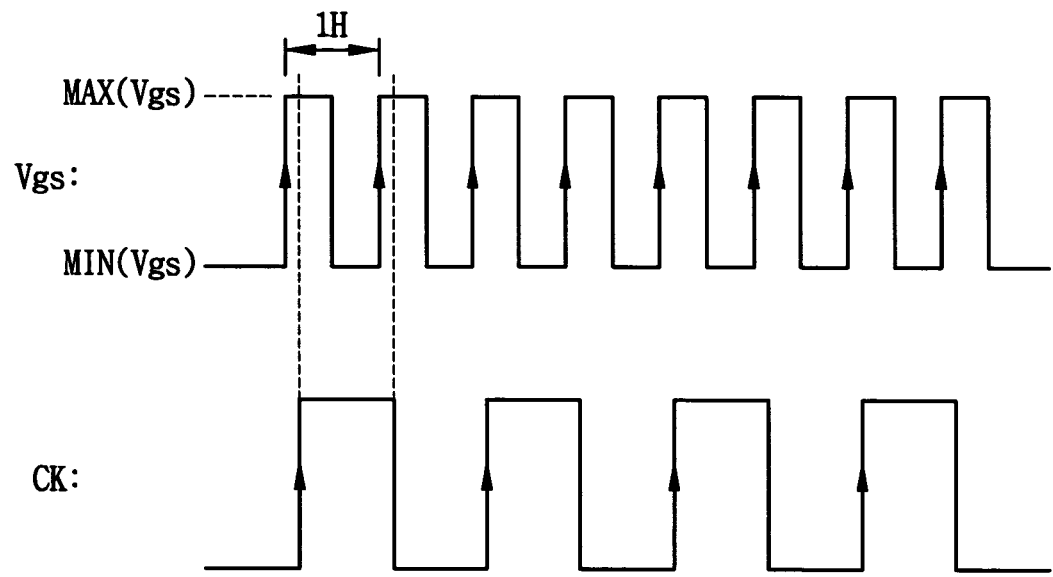
FIG. 9 is a timing diagram showing further another gate-source voltage signal applied to the a-Si TFT.
Figure 10:
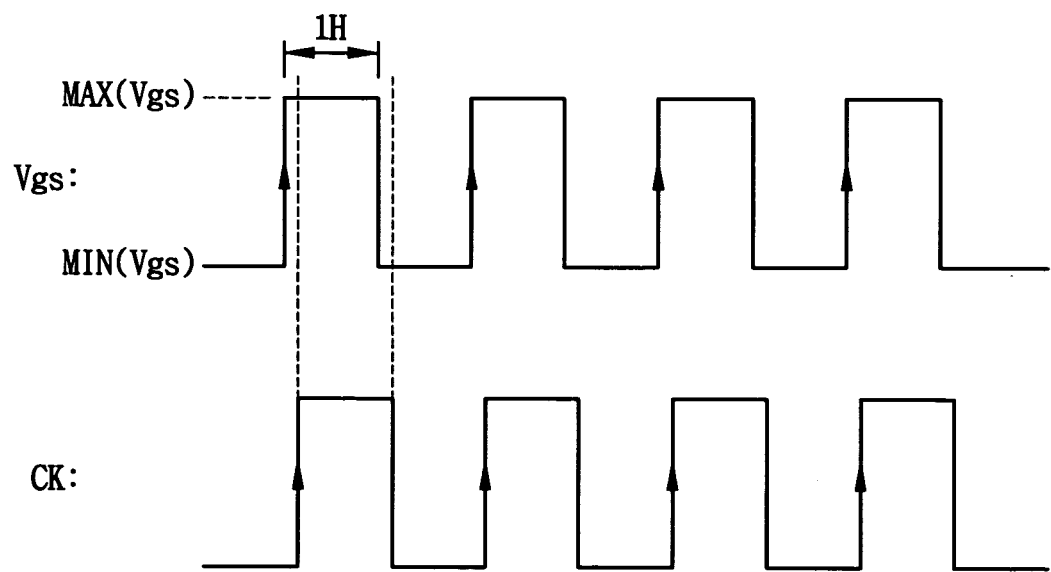
FIG. 10 is a timing diagram showing still another gate-source voltage signal applied to the a-Si TFT.

FIGS. 9 and 10 are timing diagrams showing further other examples of the gate-source voltage applied to the a-Si TFT. As shown in FIGS. 9 and 10, the phase of the gate-source voltage signal leads that of the clock CK. In FIG. 9, the phase of the rising edge of the gate-source voltage signal leads the phase of the transition of the clock CK. In FIG. 10, the phase of the rising edge of the gate-source voltage signal leads the phase of the rising edge of the clock CK.

Although the exemplary embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A shift register having a plurality of stages each providing a gate line driving signal to a corresponding gate line of a display panel, the stages each comprising:
    a pull-up part to generate a current gate line driving signal having a first state in response to a first control signal and a clock signal;
    a pull-down part to generate the current gate line driving signal having a second state in response to a second control signal;
    a pull-up driver to generate the first control signal to control the pull-up part in response to an adjacent previous gate line driving signal provided from an adjacent previous stage, an adjacent following gate line driving signal provided from an adjacent following stage, and an input voltage signal externally provided; and
    a pull-down driver to generate the second control signal to control the pull-down part in response to the first control signal and the input voltage signal, the pull-down driver futher comprising an inverter to generate a third control signal in response to the input voltage signal and the first control signal from the pull-up driver, and a deterioration compensation part to generate the second control signal in response to the input voltage signal, the first control signal from the pull-up driver, and the third control signal from the inverter;
    wherein the second control signal swings between first and second voltage levels in association with the input voltage signal that swings between predetermined voltage levels and wherein the first voltage level is configured to exceed the threshold voltage level of the pull-down part that is increased due to deterioration thereof.

2. The shift register of claim 1, wherein the second control signal is a pulse signal having a period substantially equal to a period of the clock signal.

3. The shift register of claim 1, wherein the second control signal is a pulse signal having a period substantially equal to a half of a period of the clock signal.

4. The shift register of claim 1, wherein the second control signal is a pulse signal having rising edges each of which is synchronized with a transition of the clock signal.

5. The shift register of claim 1, wherein the second control signal is a pulse signal having rising edges each of which is synchronized with a rising edge of the clock signal.

6. The shift register of claim 1, wherein the second control signal is a pulse signal having a phase leading a phase of the clock such that every rising edge of the second control signal leads every transition of the clock signal by a selected time period.

7. The shift register of claim 1, wherein the second control signal is a pulse signal having a phase leading a phase of the clock such that every rising edge of the second control signal leads every rising edge of the clock signal by a selected time period.

8. The shift register of claim 1, wherein the pull-up part includes a pull-up transistor having a conduction path between a terminal receiving the clock signal and a terminal generating the current gate line driving signal, and a gate electrode receiving the first control signal from the pull-up driver; and the pull-up driver includes a hold transistor to maintain a voltage level at the gate electrode of the pull-up transistor at a selected voltage level, the hold transistor having a gate electrode receiving the second control signal from the pull-down driver.

9. The shift register of claim 8, wherein an amplitude of a gate-source voltage of the hold transistor is larger than two times a threshold voltage of the hold transistor.

10. The shift register of claim 8, wherein the input voltage signal has an amplitude larger than seven times a threshold voltage of the hold transistor.

11. The shift register of claim 1, wherein the pull-down part includes a pull-down transistor having a conduction path between a terminal generating the current gate line driving signal and a terminal having a selected voltage level, and a gate electrode receiving the second control signal from the pull-down driver.

12. The shift register of claim 11, wherein an amplitude of a gate-source voltage of the pull-up transistor is larger than two times a threshold voltage of the pull-up transistor.

13. The shift register of claim 11, wherein the input voltage signal has an amplitude larger than seven times a threshold voltage of the pull-up transistor.

14. The shift register of claim 1, wherein the inverter includes:
    a first transistor having a conduction path between a terminal receiving the input voltage signal and a first node, the first transistor operating as a diode; and
    a second transistor having a conduction path between the first node and a terminal having a selected voltage level and a gate electrode receiving the first control signal from the pull-up driver,
    wherein the inverter generates the third control signal from the first node.

15. The shift register of claim 14, wherein the deterioration compensation part includes:
    a third transistor having a conduction path between the terminal receiving the input voltage signal and a second node and a gate electrode receiving the third control signal from the inverter; and
    a fourth transistor having a conduction path between the second node and the terminal having the selected voltage level and a gate electrode receiving the first control signal from the pull-up driver,
    wherein the deterioration compensation part generates the second control signal from the second node.

16. The shift register of claim 15, wherein the second control signal is provided to a gate electrode of a pull-down transistor in the pull-down part and a gate electrode of a hold transistor in the pull-up driver, the input voltage signal having an amplitude larger than seven times a threshold voltage of the pull-down transistor or the hold transistor.

* * * * *